United States Patent [19]

Manes et al.

[11] Patent Number: 4,502,099
[45] Date of Patent: Feb. 26, 1985

[54] PRINTED CIRCUIT CARD AIR COOLING SYSTEM

[75] Inventors: Kenneth L. Manes, Lafayette; William D. Hart, Louisville, both of Colo.

[73] Assignee: Storage Technology Partners II, Louisville, Colo.

[21] Appl. No.: 497,049

[22] Filed: May 27, 1983

[51] Int. Cl.³ ............................................. H05K 7/20
[52] U.S. Cl. .................................. 361/383; 361/415; 165/137; 165/104.33
[58] Field of Search ............ 62/418; 165/137, 104.33, 165/72, 75, 80 B, 80 C, 80 D, 53, 54; 174/15 R, 16 R; 211/41; 361/382, 383, 384, 415

[56] References Cited

U.S. PATENT DOCUMENTS

| | | | |
|---|---|---|---|
| 3,298,195 | 1/1967 | Raskhodoff | 165/80 B |
| 3,387,648 | 6/1968 | Ward, Jr. | 165/104.33 |
| 3,917,370 | 11/1975 | Thornton | 165/80 C |
| 4,149,218 | 4/1979 | Carrubba | 165/80 C |

Primary Examiner—G. P. Tolin
Attorney, Agent, or Firm—James R. Young

[57] ABSTRACT

An improved cooling system for electronic components wherein an air supply housing with two openings cooperates with a manifold with one opening to allow air distribution from the air supply housing through the manifold to a card cage both while the manifold is closed for normal operation and while the manifold is extended to allow maintenance of the electronic components. When the manifold is closed for normal operation, the first opening in the air supply housing is blocked by the manifold and air flows into the manifold through the second opening. When the manifold is extended for maintenance, air flows into the manifold through the first opening and the second opening is blocked by a flapper which swings down over the second air supply housing opening.

10 Claims, 4 Drawing Figures

PRINTED CIRCUIT CARD AIR COOLING SYSTEM

BACKGROUND OF THE INVENTION

This invention relates to cooling systems and more particularly to a cooling system for use in cooling electronic components. Even more particularly, this invention relates to a cooling system for cooling electronic printed circuit cards which are mounted in a rack, or card cage.

In any electronic or electro-mechanical device where the electronic circuitry is mounted on printed circuit cards which are organized so that they may be installed in a rack, or card cage, appreciable heat is generated, and this heat must be transferred away from the printed circuit cards or it will destroy or seriously damage them. Normally the printed circuit cards are cooled by air flow provided by fans or the like. In order to maintain this equipment, access is needed to the printed circuit cards so that they may be removed and replaced and so that test equipment may be attached to the cards to test the circuits. In modern electronic devices, the card cage typically is mounted inside the device during normal operation and must be transferred outside the device for maintenance. While outside the device during maintenance, the device must still be capable of operating, thus the printed circuit cards must be cooled by air flow, just as they are cooled when the card cage is inside the device.

In the prior art, mechanisms for cooling printed circuit cards which allow the card cage to move are of two general types: those which provide cooling air to the card cage by means of a hose connected to a central air supply, and those which mount cooling fans directly to the bottom of the card cage. Each of these mechanisms has certain strong points and weak points, as discussed below. An important advantage of the present invention is that it overcomes all the disadvantages of the prior art, while retaining all the advantages of both of the prior art mechanisms.

The hose mechanism has the advantage that air is supplied by one central fan motor which reduces cost both in the motor and in providing noise reduction. It is also less expensive to monitor the operation of this one fan and shut down the device if the fan motor should fail. Since the air always passes this fan, the air can be filtered at this point, thus only one filter is needed to ensure that the air is free of contaminating particles. The disadvantage to this system is that a flexible air hose is needed to connect the central air supply to the card cage. This hose adds cost to the device and increases maintenance. If the card cage is not moved from the maintenance position to the normal operating position carefully, the hose can become pinched, and the air supply to the card cage will be reduced or shut off causing the components to eventually fail. To provide sufficient air, this hose must be large and bulky. Providing space for this bulky hose increases the overall size and cost of the device.

By mounting fans directly to the bottom of the card cage, the hose can be eliminated. In many systems, however, the card cage is large enough to require several fans, thus increasing the overall cost of the device. Increasing the number of fans also increases the failure rate. Extra electrical wiring must be provided to the fans, extra noise reduction material must be added, and normally, an air filter must be provided for each fan.

The advantage of the present invention over the prior art is that it allows for a central air supply, thus reducing cost and maintenance, while it does not require a hose to connect this air supply to the card cage.

SUMMARY OF THE INVENTION

It is the object of the present invention to provide an improved cooling system for electronic components.

It is a further object of the present invention to provide such a system that has one central air supply connected to a card cage which can be moved from one position to another, while eliminating the need for a flexible air hose to connect the air supply and the card cage.

The above and other objects of the present invention are realized through the use of an assembly comprised of an air supply housing having two openings and a manifold having one opening slidably attached to the air supply housing. Also attached to the manifold is a card cage which holds the printed circuit cards. When the manifold is in a closed position, air flow from one of the openings in the air supply housing into the manifold through its opening and on through the manifold into the card cage. When the manifold is in an extended position, air flows from the second opening in the air supply housing into the manifold through its opening and on through the manifold into the card cage.

While in either position, the unused opening in the air supply housing is blocked so that air cannot escape.

BRIEF DESCRIPTION OF THE DRAWINGS

The above and other objects, features, and advantages of the present invention will be more apparent from the following more particular description of the preferred embodiment presented in connection with the following drawings, wherein.

DESCRIPTION OF THE PREFERRED EMBODIMENT

The following is a description of the best presently contemplated mode of carrying out the present invention. This description if given only to illustrate the general principles of the invention and is not to be taken in a limiting sense. The true scope of the invention can be ascertained by reading the appended claims.

Figure 1:
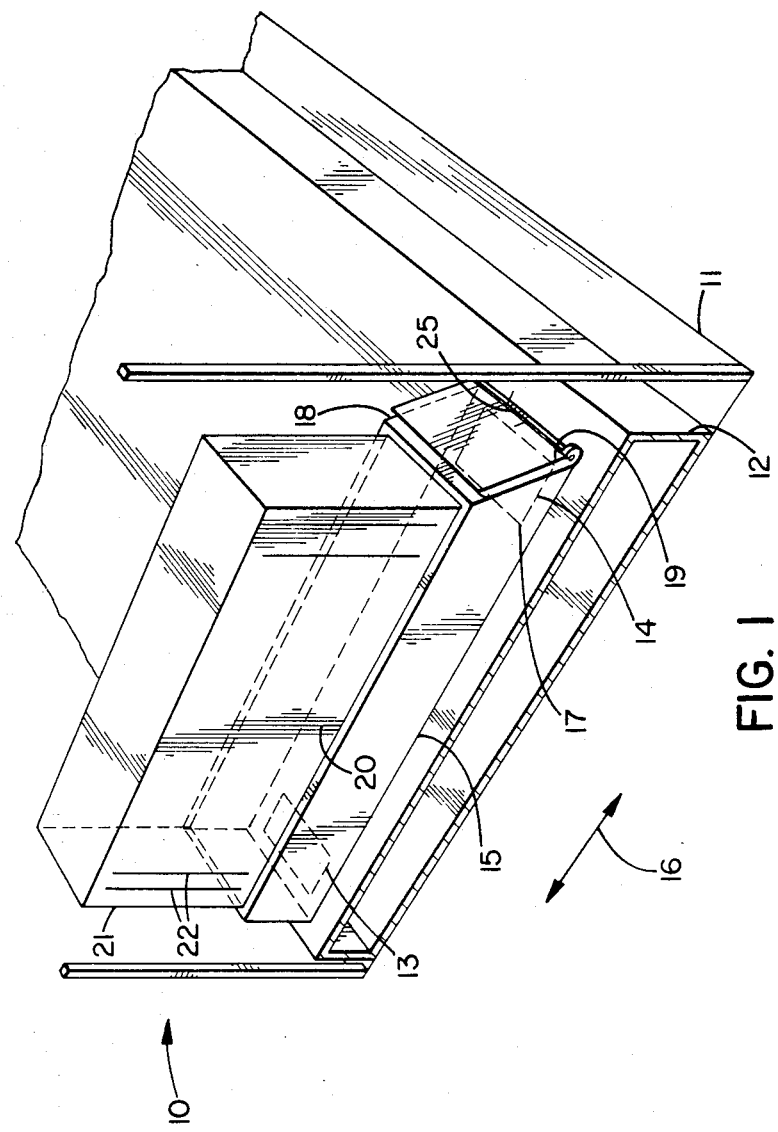
FIG. 1 depicts the environment in which the cooling system of the present invention is typically used.

FIG. 1 is a simplified representation of an electronic device 10, and is shown to illustrate the environment in which the present invention would likely be used. A frame 11 provides support for an air supply housing 12 which contains two openings 13 and 14. A manifold 15 is mounted to one side of the air supply housing 12 and can slide in the directions shown by arrow 16. The manifold 15 has an opening 17 which is located directly opposite the air supply housing opening 14 when the manifold is in the closed position as shown by FIG. 1. When the manifold 15 is in a closed position as illustrated in FIG. 1, the tapered end 18 of the manifold 15 moves a flapper 19 out of the way so that air from the air supply housing 12 can pass through air supply housing opening 14 and through manifold opening 17, into the manifold and out of the manifold through a top manifold opening 20 into a card cage 21 to cool the printed circuit cards 22. The flapper 19 is held in position by a spring 25.

Figure 2:
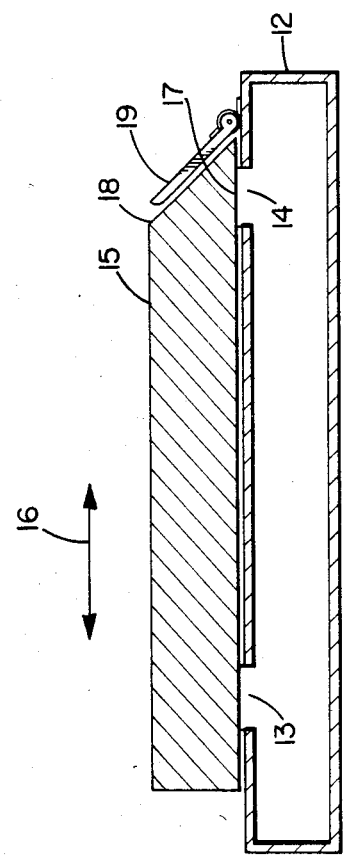
FIG. 2 is a simplified drawing of the manifold and air supply housing showing the manifold in the closed position.

FIG. 2 is a side view of the cooling system and shows the manifold 15 which slides in the directions indicated by the arrow 16. The manifold 15 has one opening 17 on the side facing the air supply housing 12 which allows air into the manifold from the air supply housing 12. The air supply housing 12 has two openings 13 and 14. When the manifold is in the closed position as shown in FIG. 2, a flapper 19 is moved out of the way by the tapered end 18 of manifold 15 and this allows air from the air supply housing 12 to pass through the air supply housing opening 14, through manifold opening 17 and into the manifold 15, and on into the card cage (not shown in FIG. 2). In this position, the manifold 15 blocks air flow from air supply housing opening 13.

Figure 3:
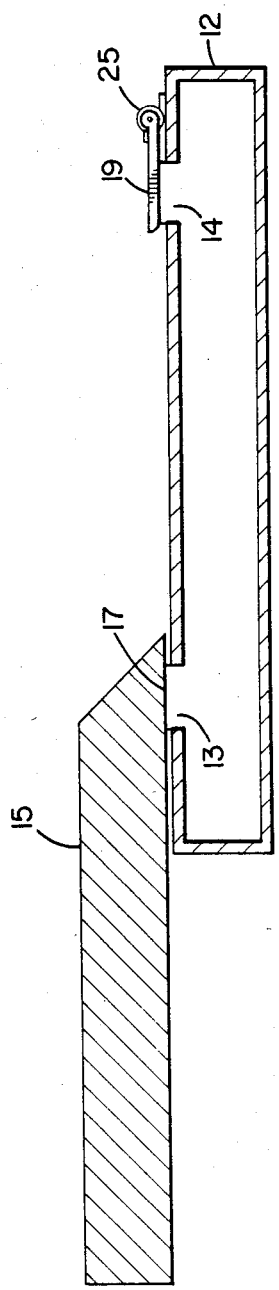
FIG. 3 shows the manifold in the extended position.

FIG. 3 is a side view of the cooling system showing the manifold 15 in the extended position. When the manifold 15 is in the extended position, air from the air supply housing 12 passes through air supply housing opening 13, through manifold opening 17 and on into the card cage (not shown in FIG. 3). When the manifold 15 is in the extended position, flappr 19 is moved by spring 25 to block air flow from air supply housing opening 14.

Figure 4:
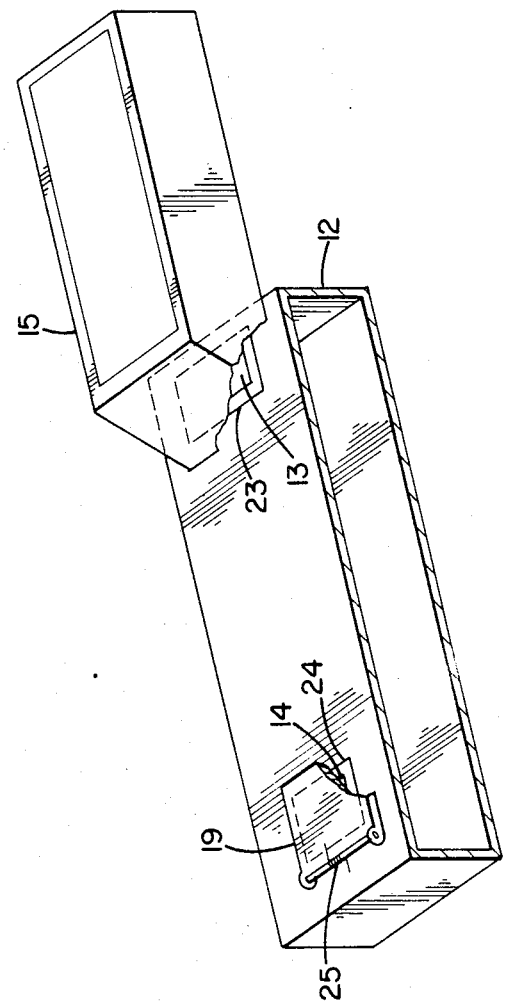
FIG. 4 is a perspective view showing the manifold in the extended position and also showing seals which may be mounted between the manifold and air supply housing.

FIG. 4 is a top perspective view of the cooling system showing manifold 15 in the extended position. This view illustrates a seal 23 which is located adjacent to air supply housing opening 13. This seal 23 serves to prevent air leakage between the air supply housing 12 and the manifold 15. A second seal 24 is located adjacent to air supply housing opening 14 and it serves to prevent air leakage between the air supply housing and the flapper 19 when the manifold 15 is in the extended position.

Although the figures have shown the air supply housing to have two openings and the manifold to have one opening, the invention is not so limited. The openings could easily be reversed such that the manifold contained two openings, the air supply housing only one, and the flapper mounted to the manifold.

What is claimed is:

1. An improved air cooling system including cooling articles in a movable enclosure, comprising:
   (a) an air supply housing having first and second openings spaced-apart on a first surface;
   (b) means for delivering pressurized cooling air into said air supply housing;
   (c) a manifold slidably connected to said air supply housing, said manifold having said article-containing enclosure rigidly mounted to a mounting surface thereof, said mounting surface having one opening therein through which cooling air from said manifold may enter said article-containing enclosure, and said manifold further having another opening on a second surface thereof through which cooling air passing through one of said first or second openings of said air supply housing may enter said manifold, said first opening of said air supply housing being positioned so that it is opposite said manifold second surface opening when said manifold is in a closed position, and said second opening of said air supply housing being positioned so that it is opposite said manifold second surface opening when said manifold is slidably moved to an extended position;
   (d) first blocking means for blocking said first opening in said air supply housing when said manifold is in the extended position; and
   (e) second blocking means for blocking said second opening in said air supply housing when said manifold is in the closed position;
   whereby cooling air flows from said air supply housing through said manifold, and into said article-containing enclosure by said air delivering means regardless of whether said manifold, and consequently said article-containing enclosure, is in the closed or extended position.

2. An improved cooling system as defined in claim 1 wherein said second blocking means comprises said second surface of said manifold.

3. An improved cooling system as defined in claim 2 wherein said first blocking means comprises a door pivotally mounted to said air supply housing so as to block said air supply housing first opening whenever said door is closed, said door including biasing means for maintaining said door in its closed position, and said door being adapted to be pivoted away from said air supply housing first opening upon movement of said manifold from the extended position to the closed position.

4. An improved cooling system as defined in claim 3 wherein said manifold has an end surface that pivots said door away from its normally closed position as said manifold is slidably moved from the extended position to the closed position.

5. An improved cooling system as defined in claim 1, further comprising sealing means interposed between said air supply housing and said manifold for preventing air from excaping from said air supply housing or said manifold.

6. In an electrical device having printed circuit cards, a cooling system for cooling said printed circuit cards, comprising:
   (a) an air supply housing having first and second openings spaced-apart on a first surface;
   (b) means for delivering pressurized air into said air supply housing;
   (c) a card cage containing said printed circuit cards;
   (d) a manifold slidably connected to said air supply housing, said manifold having said card cage rigidly mounted to a mounting surface thereof, said mounting surface having one opening therein through which cooling air from said manifold may enter said card cage, and said manifold further having another opening on a second surface thereof through which cooling air passing through one of said first or second openings of said air supply housing may enter said manifold, said first opening of said air supply housing being positioned so that it is opposite said manifold second surface opening when said manifold is in a closed position, and said second opening of said air supply housing being positioned so that it is oppposite said manifold second surface opening when said manifold is slidably moved to an extended position;
   (e) first means for blocking said first opening in said air supply housing when said manifold is in the extended position; and (f) second means for blocking said second opening in said air supply housing when said manifold is in the closed position;

whereby cooling air flows from said air supply housing through said manifold, and into said card cage by said air delivering means regardless of whether said manifold, and consequently said card cage, is in the closed or extended position.

7. An improved cooling system as defined in claim 6 wherein said second blocking means comprises said second surface of said manifold.

8. An improved cooling system as defined in claim 7 wherein said first blocking means comprises a door pivotally mounted to said air supply housing so as to block said air supply housing first opening whenever said door is closed, said door including biasing means for maintaining said door in its closed position, and said door being adapted to be pivoted away from said air supply housing first opening upon movement of said manifold from the extended position to the closed position.

9. An improved cooling system as defined in claim 8 wherein said manifold has an end surface that pivots said door away from its normally closed position as said manifold is slidably moved from the extended position to the closed position.

10. An improved cooling system as defined in claim 9, further comprising a sealing means interposed between said air supply housing and said manifold for preventing air from escaping from said air supply housing or said manifold.

* * * * *